Aug. 6, 1957 V. R. BECK ET AL 2,802,100
TRANSISTOR RECEIVER WITH CONSTANT IMPEDANCE MANUAL-GAIN CONTROL BETWEEN I. F. AMPLIFIER AND DETECTOR
Filed Aug. 15, 1955
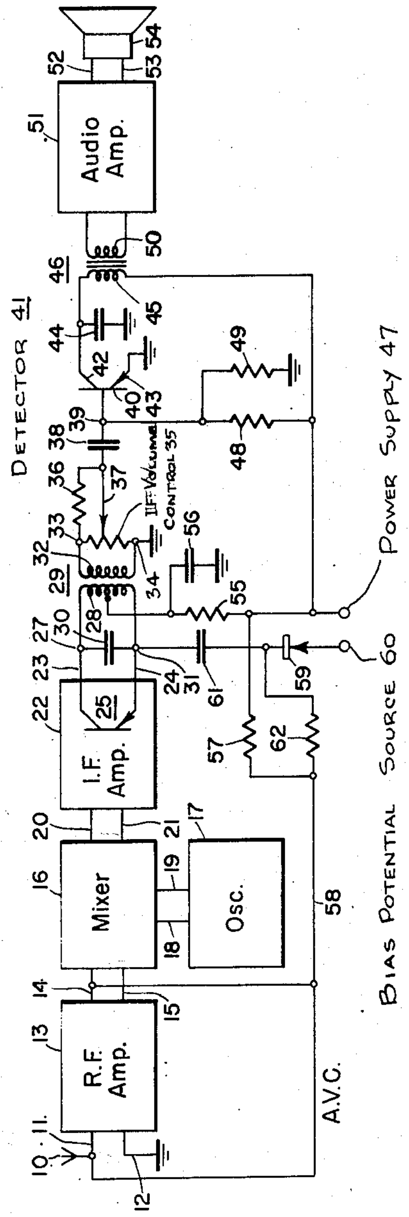
VIRGIL R. BECK
WILLIAM S. PATRICK
*INVENTORS.*
BY John J. Pederson
THEIR ATTORNEY.

United States Patent Office 2,802,100

Patented Aug. 6, 1957

2,802,100

TRANSISTOR RECEIVER WITH CONSTANT IMPEDANCE MANUAL-GAIN CONTROL BETWEEN I. F. AMPLIFIER AND DETECTOR

Virgil R. Beck, Elmhurst, and William S. Patrick, Lombard, Ill., assignors to Zenith Radio Corporation, a corporation of Illinois Application August 15, 1955, Serial No. 528,175

4 Claims. (Cl. 250—20)

This invention relates to wave-signal receivers and more particularly to such receivers which utilize transistors to perform the conventional amplifier, oscillator, and detector functions.

Although the use of transistors is no longer uncommon, there still remain practical problems in the substitution of transistors for vacuum tubes in radio receivers; this is evident from even a cursory inspection of transistorized receivers already offered for commercial use. One specific problem relates to the employment of a transistor as the second detector, or audio-frequency (A. F.) demodulator, in a superheterodyne radio receiver. Both impedance-matching considerations and the desirability of low-level operation militate against the use of a diode as the second detector, but render employment of a transistor highly desirable. However, a straightforward substitution of a transistor for a diode in such a circuit is not without disadvantages.

In conventional vacuum tube radio receivers, the volume control, usually a potentiometer, is positioned in the output circuit of the second detector or in the input circuit of the ensuing audio amplifier. By moving the potentiometer arm the amount of signal coupled to the audio amplifier is varied. If the volume control is connected conventionally in a radio receiver employing transistors for the several stages, serious difficulty is encountered upon coupling a strong signal to the second detector stage. The desire for miniaturization, and the practical and economic advantages attendant upon construction of a physically small radio receiver, dictate that the D.-C. or B-supply operating voltage for a transistorized receiver be as low as possible, of the order of six volts. When such a voltage is connected through a volume control potentiometer to the collector element of a transistor-detector and to the automatic-volume-control (AVC) circuit, the difficulty encountered at high signal levels is readily apparent. A strong signal causes greater current flow through the second detector, which effects a larger voltage drop across the volume control, leaving a smaller operating potential for the collector element of the transistor; this diminished operating potential can become insufficient for satisfactory operation. As the voltage drop across the volume control approaches the B-supply voltage, the rate of increase of the AVC bias potential decreases. This difficulty, which is inherent in a transistor set employing a low voltage, a transistor for the second detector, and conventionally connected volume control and AVC circuits, is normally compensated for in one of two ways. First, it is possible to utilize a higher supply voltage, from 12 to 45 volts; this affords a higher operating potential for the collector element of the transistor, even when a strong signal appears at the second detector. The second method of compensating is to add one or more stages of amplification, in addition to the audio amplifier normally employed, after the second detector. Obviously both these expedients add substantially to the bulk and to the manufacturing cost of a transistorized radio receiver.

It is an object of the invention to permit use of a transistor as the second detector of a superheterodyne radio receiver without necessitating either unduly large B-supply voltages or extra stages of amplification after the second detector.

It is another object of the invention to permit use of a transistor as the second detector of a superheterodyne radio receiver without substantially diminishing the operating potential applied to the output circuit of the second detector under strong-signal conditions.

It is a further object of the invention to retain the advantages enumerated above and simultaneously to permit inclusion of a fully effective automatic-volume-control circuit.

In accordance with the invention a wave-signal receiver comprises means for receiving a modulated radio-frequency wave signal and means, coupled to the receiving means, for converting the radio-frequency wave signal to a corresponding intermediate-frequency wave signal. An intermediate-frequency signal amplifier, coupled to the converting means, includes a transistor output stage for amplifying the intermediate-frequency wave signal. The detector means includes a transistor for developing an output signal corresponding to modulation components of the intermediate-frequency signal. The intermediate-frequency amplifier is coupled to the detector through means including a volume control potentiometer to provide manual control of the amplitude of the output signal, and means are coupled to the detector for utilizing the output signal.

The features of the present invention which are believed to be novel are set forth with particularity in the appended claims. The invention, together with further objects and advantages thereof, may best be understood by reference to the following description taken in connection with the accompanying drawing, the single figure of which is a diagram, partly schematic and partly in block form, of a preferred embodiment of the invention.

The drawing shows a superheterodyne radio receiver in which an antenna 10 is connected to a lead 11 which, with a grounded lead 12, is connected to a radio-frequency (R. F.) amplifier 13. The output terminals of R. F. amplifier 13 are connected through leads 14 and 15 to a mixer 16; an oscillator 17 is also connected to mixer 16, through leads 18 and 19. The output of mixer 16 is connected through leads 20 and 21 to the input terminals of an I. F. amplifier, which includes a transistor output stage 25. The collector of transistor output stage 25 is connected through a lead 23 to one terminal 27 of the primary winding 28 of an I. F. transformer 29. A capacitor 30 is parallel-connected with primary winding 28, and the other terminal 31 of primary winding 28 is connected through a lead 24 to the emitter of transistor output stage 25. A decoupling resistor 55, which may be omitted without substantially degrading performance, is connected between a center-tap on primary winding 28 and a source of unidirectional operating potential or power supply 47. The center-tap of primary winding 28 is also connected to one plate of a filter capacitor 56, the other plate of which is connected to ground.

The upper terminal of the secondary winding 32 of I. F. transformer 29 is connected to a terminal 33, and the opposite terminal 34 of secondary winding 32 is connected to ground. In accordance with the invention, a volume control potentiometer 35 is connected between terminals 33 and 34. A fixed resistor 36 is connected between terminal 33 and the movable arm 37 potentiometer 35; arm 37 is further connected to one plate of a coupling capacitor 38, the other plate of which is connected to a terminal 39. Terminal 39 is connected to the base element 40 of a transistor constituting second detector 41 of the receiver; the transistor further includes a collector element 42 and a grounded emitter element 43. Collector element 42 is connected both to one plate of a capacitor 44, the other plate of which is connected to ground, and to the upper terminal of the primary winding 45 of an audio-frequency coupling transformer 46; the lower terminal of primary winding 45 is connected to potential source 47. A first dropping resistor 48 is connected between potential source 47 and terminal 39, and a second dropping resistor 49 is connected between terminal 39 and ground. Resistors 48 and 49 constitute a voltage divider network for developing the correct bias for application to base element 40 of second detector 41. Secondary winding 50 of coupling transformer 46 is connected to an audio amplifier 51, the output of which is connected through leads 52 and 53 to a loudspeaker 54.

Further in accordance with the invention, a diode 59 is connected between a source of unidirectional bias potential 60 and a coupling capacitor 61 connected to terminal 31, for providing an automatic volume control potential for application to an AVC lead 58. A resistor 57 is connected between potential source 47 and AVC lead 58, to provide a constant bias for the AVC circuit. A resistor 62 is connected between AVC lead 58 and the junction of diode 59 and capacitor 61. AVC lead 58 is connected to the input of R. F. amplifier 13 through lead 11, and to the input of mixer 16 through lead 14.

In operation, an R. F. signal appearing at antenna 10 is coupled through lead 11 of R. F. amplifier 13, and thence to the input of mixer 16; oscillator 17 simultaneously couples a heterodyne-frequency signal to mixer 16. The intermediate-frequency signal developed by mixer 16 is coupled to I. F. amplifier 22, whose output is translated through I. F. coupling transformer 29 to volume control 35. A portion of the I. F. signal appearing across volume control 35, depending on its setting, is coupled through capacitor 38 to second detector 41. The audio output of second detector 41 is applied through transformer 46 to audio amplifier 51, and thence to speaker 54.

The I. F. input signal applied to second detector 41 varies with the setting of movable arm 37 of volume control 35; when arm 37 is positioned at terminal 33, the maximum signal is coupled to detector 41, and when arm 37 is adjacent terminal 34, the minimum signal is coupled. The volume control and detector circuits are unconventional because, in accordance with the invention, their relative positions are interchanged. Conventionally the volume control is in the audio output circuit of the second detector, but in receivers embodying the invention volume control 35 is positioned in the I. F. channel preceding the input circuit of second detector 41. Removal of the volume control from the collector circuit of the second detector prevents large signals from causing an excessive voltage drop across the volume control and leaving insufficient operating potential for the collector element.

Resistor 36 is provided to prevent a gross impedance mismatch between the output circuit of I. F. amplifier 22 and the input circuit of second detector 41 at certain settings of volume control arm 37. The conventional types of transistors employed as output stage 25 and second detector 41 require that, for optimum performance, output stage 25 should work into an impedance of approximately 15,000 ohms, while the input circuit of second detector 41 presents an impedance of only approximately 800 ohms. These two values determine the turns ratio of I. F. coupling transformer 29, which is approximately 20:1. It is apparent that should the impedance looking from the secondary winding 32 become higher than the 800 ohms exhibited by the input circuit of second detector 41, the higher impedance is reflected through coupling transformer 29 to the output circuit of I. F. amplifier 22, thus presenting an impedance larger than the optimum 15,000 ohm value. This is extremely undesirable; if a mismatch must occur, it is more desirable that the impedance appearing in the output circuit of I. F. amplifier 22 be reduced to effect adequate power transfer from that stage.

Volume control potentiometer 35 in this embodiment may have a resistance value of the order of 10,000 ohms. In the absence of resistor 36, when arm 37 of volume control 35 is at terminal 33, the impedance seen looking through transformer 29 from primary to secondary is the input impedance of second detector 41 transformed by the impedance ratio of transformer 29.

Coupling capacitor 38 may be neglected when considering the impedance variations, for it is large enough so that its impedance is significant only at very low frequencies; when arm 37 is at terminal 33 a direct connection for I. F. energy is established from terminal 33 to second detector 41. However, when arm 37 is displaced to terminal 34, an effective impedance of the order of 10,000 ohms appears across secondary winding 32; when reflected back through transformer 29 to the output circuit of I. F. amplifier 22 this effective impedance is magnified by a factor corresponding to the transformer impedance ratio and drastically reduces the power-handling capacity of the I. F. amplifier. To minimize any undesirable mismatch when arm 37 is connected to terminal 34, resistor 36, which may have a resistance value of the order of 1,000 ohms, is connected between terminal 33 and arm 37. Resistor 36 always shunts the portion of volume control 35 connected between terminal 33 and arm 37; when arm 37 is adjacent to terminal 34 the total impedance of the parallel combination is of the same order of magnitude as the input impedance of transistor detector 41. Resistor 36 thus minimizes the impedance mismatch in the secondary of transformer 29 as arm 37 is displaced from terminal 33 to terminal 34 by preventing the resistance appearing between secondary winding 32 and coupling capacitor 38 from exceeding the resistance of resistor 36.

Resistor 36 also prevents the unloading of secondary winding 32 as more resistance is placed in parallel with the secondary winding by displacing arm 37 toward terminal 34; as more resistance is added in parallel, the untuned secondary winding is unloaded, and therefore the bandwidth of the transformer is narrowed. By constantly shunting the effective portion of volume control 35, resistor 36 prevents substantial unloading of the secondary circuit and thus preserves an essentially constant bandwidth throughout the effective range of volume control 35.

Further in accordance with the invention, diode 59 is coupled to the output circuit of I. F. amplifier 22 to generate a unidirectional control voltage which varies in accordance with signal strength and may be employed to effect automatic volume control. In conventional receivers, the AVC voltage is derived from the second detector; however, when the manual volume control is placed across the I. F. transformer as in the illustrated embodiment of the invention, the second detector output is dependent on volume control setting and is therefore unsuitable for AVC purposes. By deriving the AGC voltage from the primary circuit of the I. F. transformer, the invention provides effective AVC action while retaining the advantages of lower power supply voltage and single-stage audio amplification attributable to the use of manual volume control in the I. F. channel.

The invention thus obviates the possibility of paralysis or loss of power-handling capacity of the second detector stage of a transistorized radio receiver due to substantially diminished operating potential under strong-signal conditions, and this is accomplished while retaining the advantages of proper interstage impedance matching and the use of a low-voltage D. C. power supply. Moreover, through the provision of diode 59, these objectives may be realized while also providing effective automatic volume control action.

By way of example only and in no sense by way of limitation, typical values for the various components shown in the circuit of the invention for satisfactory operation are:

| | |
|---|---|
| Resistor 36 | 1,000 ohms. |
| Resistor 48 | 39,000 ohms. |
| Resistor 49 | 5,600 ohms. |
| Resistor 55 | 1,000 ohms. |
| Resistor 57 | 470,000 ohms. |
| Resistor 62 | 68,000 ohms. |
| Potentiometer 35 | 10,000 ohms. |
| Capacitor 38 | 0.001 microfarad. |
| Capacitor 44 | 0.005 microfarad. |
| Capacitor 56 | 0.05 microfarad. |
| Capacitor 61 | 100 micromicrofarads. |
| Diode 59 | 1N64. |
| Transistors 25 and 41 | Sylvania type 2N94, or Raytheon type CK760, or GE type 2N123. |

Terminal 47: connected to negative 6.0 volts, D. C.
Terminal 60: connected to negative 1.5 volts, D. C.

While a particular embodiment of the invention has been shown and described it is apparent that modifications and alterations may be made, and it is intended in the appended claims to cover all such modifications and alterations as may fall within the true spirit and scope of the invention.

We claim:

1. A wave-signal receiver comprising: means for receiving a modulated-carrier wave signal; an amplifier coupled to said receiving means and comprising a high-impedance transistor output stage for amplifying said modulated-carrier wave signal; low-impedance transistor detector means for developing an output signal corresponding to modulation components of said modulated-carrier wave signal; means coupling said amplifier to said detector means, said means including a variable volume control potentiometer having a pair of fixed terminals coupled to said output stage and a variable terminal coupled to said detector means to provide manual control of the amplitude of said output signal; a resistor connected between one of said fixed terminals and said variable terminal for maintaining substantial impedance matching between said output stage and said detector means at all settings of said variable terminal; and means coupled to said detector means for utilizing said output signal.

2. A wave-signal receiver comprising: means for receiving a modulated-carrier wave signal; an amplifier coupled to said receiving means and comprising a high-impedance transistor output stage for amplifying said modulated-carrier wave signal; low-impedance transistor detector means for developing an output signal corresponding to modulation components of said modulated-carrier wave signal; means including a coupling transformer, having a primary winding connected to said output stage and a secondary winding connected to said detector means, for coupling said amplifier to said detector means; means including a variable volume control potentiometer, comprising a fixed resistance shunt-connected across said secondary winding and a variable terminal coupled to said detector means, for providing manual control of the amplitude of said output signal; a resistor connected between one of the terminals of said secondary winding and said variable terminal for maintaining substantial impedance matching between said output stage and said detector means at all settings of said variable terminal; and means coupled to said detector means for utilizing said output signal.

3. A wave-signal receiver comprising: means for receiving a modulated-carrier wave signal; an amplifier coupled to said receiving means and comprising a transistor output stage having a relatively high output impedance for amplifying said modulated-carrier wave signal; transistor detector means, having an input impedance substantially smaller than said output impedance, for developing an output signal corresponding to modulation components of said modulated-carrier wave signal; means including a coupling transformer, having primary and secondary windings and having a primary-to-secondary impedance ratio substantially corresponding to the ratio between said output and input impedances, for coupling said amplifier to said detector means; means including a variable volume control potentiometer, comprising a fixed resistance shunt-connected across the secondary winding of said transformer and a variable terminal coupled to said detector means, for providing manual control of the amplitude of said output signal; a resistor, having an impedance substantially equal to said input impedance of said detector means, connected between one of the terminals of said secondary winding and said variable terminal, for maintaining substantial impedance matching between said output stage and said detector means at all settings of said variable terminal; and means coupled to said detector means for utilizing said output signal.

4. A wave-signal receiver comprising: means for receiving a modulated-carrier wave signal; an amplifier coupled to said receiving means and comprising a transistor output stage for amplifying said modulated-carrier wave signal; transistor detector means for developing an output signal corresponding to modulation components of said modulated-carrier wave signal; a coupling transformer comprising a primary winding coupled to said output stage and a secondary winding coupled to said detector means; a variable volume control potentiometer comprising a fixed resistance shunt-connected across said secondary winding and a variable terminal coupled to said detector means to provide manual control of the amplitude of said output signal; a resistor connected between one of the terminals of said secondary winding and said variable terminal for maintaining substantial impedance matching between said output stage and said detector means at all settings of said variable terminal; rectifier means coupled to said transistor output stage for developing a control voltage proportional to the amplitude of said received wave signal; means for applying said control voltage to said receiving means to effect automatic volume control of said receiver; and means coupled to said detector means for utilizing said output signal.

References Cited in the file of this patent

UNITED STATES PATENTS

| | | |
|---|---|---|
| 1,796,375 | Kent | Mar. 17, 1931 |
| 2,184,104 | Smith | Dec. 19, 1939 |
| 2,207,023 | Pratt | July 9, 1940 |
| 2,536,501 | Hood et al. | Jan. 2, 1951 |
| 2,647,957 | Mallinckrodt | Aug. 4, 1953 |

OTHER REFERENCES

Radio Broadcast, vol. 14, February 1929, article at page 257.

Transistor Broadcast Receivers, by Stern and Raper, Electrical Engineering, December 1954, pp. 1107–1112. (Revised text of a paper delivered at March 1954 National I. R. E. Convention.)

Mallory Radio Service Encyclopedia, 3rd ed., 1939, page 213. (Copy in Scientific Library, TK–6550–M 28.)